United States Patent
Shin et al.

(10) Patent No.: US 12,431,422 B2
(45) Date of Patent: Sep. 30, 2025

(54) SEMICONDUCTOR DEVICE AND METHOD OF FORMING RDL WITH GRAPHENE-COATED CORE

(71) Applicant: STATS ChipPAC Pte. Ltd., Singapore (SG)

(72) Inventors: YongMoo Shin, Incheon (KR); HyunSeok Park, Gyeonggi-do (KR); KyoWang Koo, Incheon (KR); Sinjae Kim, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 336 days.

(21) Appl. No.: 18/150,567

(22) Filed: Jan. 5, 2023

(65) Prior Publication Data

US 2024/0234291 A1    Jul. 11, 2024

(51) Int. Cl.
*H01L 23/00* (2006.01)
*H01L 21/48* (2006.01)
(Continued)

(52) U.S. Cl.
CPC .... *H01L 23/49877* (2013.01); *H01L 21/4857* (2013.01); *H01L 23/49822* (2013.01); *H01L 23/49894* (2013.01); *H01L 25/16* (2013.01); *H01L 24/05* (2013.01); *H01L 24/13* (2013.01); *H01L 24/16* (2013.01); *H01L 2224/05611* (2013.01); *H01L 2224/05613* (2013.01);
(Continued)

(58) Field of Classification Search
CPC .......... H01L 23/49877; H01L 21/4857; H01L 23/49822; H01L 23/49894; H01L 25/16; H01L 23/49827; B32B 9/007; H05K 1/09; H05K 1/181; H05K 2201/0218
See application file for complete search history.

(56) References Cited

U.S. PATENT DOCUMENTS 8,107,242 B2 * 1/2012 Yoshimoto ............. H05K 5/065
                                                                    361/721
8,535,553 B2    9/2013 Kong et al.
(Continued)

FOREIGN PATENT DOCUMENTS

KR            101465616 B1    11/2014

*Primary Examiner* — Timothy J Thompson
*Assistant Examiner* — Aditya Sharma
(74) *Attorney, Agent, or Firm* — Robert D. Atkins; PATENT LAW GROUP: Atkins and Associates, P.C.

(57) ABSTRACT

A semiconductor device has a one-layer interconnect substrate and electrical component disposed over a first surface of the interconnect substrate. The electrical components can be discrete electrical devices, IPDs, semiconductor die, semiconductor packages, surface mount devices, and RF components. An RDL with a graphene core shell is formed over a second surface of the interconnect substrate. The graphene core shell has a copper core and a graphene coating formed over the copper core. The RDL further has a matrix to embed the graphene core shell. The graphene core shells through RDL form an electrical path. The RDL can be thermoset material or polymer or composite epoxy type matrix. The graphene core shell is embedded within the thermoset material or polymer or composite epoxy type matrix. The RDL with graphene core shell is useful for electrical conductivity and electrical interconnect within an SIP.

32 Claims, 10 Drawing Sheets

(51) Int. Cl.
*H01L 23/498* (2006.01)
*H01L 25/16* (2023.01)

(52) U.S. Cl.
CPC .............. *H01L 2224/05616* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/16227* (2013.01)

(56) References Cited

U.S. PATENT DOCUMENTS

| | | | |
|---|---|---|---|
| 8,710,649 B1 | 4/2014 | Huemoeller et al. | |
| 9,305,854 B2 | 4/2016 | Shim et al. | |
| 10,421,123 B2 | 9/2019 | Jeong et al. | |
| 10,566,104 B2* | 2/2020 | Lee | B22F 1/0547 |
| 10,854,549 B2* | 12/2020 | Nakano | H01L 23/5384 |
| 2002/0104669 A1* | 8/2002 | Underwood | H05K 9/0039 |
| | | | 174/370 |
| 2009/0152715 A1 | 6/2009 | Shim et al. | |
| 2010/0109688 A1 | 5/2010 | Eldridge et al. | |
| 2012/0132930 A1* | 5/2012 | Young | H05K 1/0313 |
| | | | 257/E31.127 |
| 2015/0179602 A1 | 6/2015 | Camcho et al. | |
| 2016/0039662 A1* | 2/2016 | Lin | H01L 21/4853 |
| | | | 438/51 |
| 2016/0286698 A1* | 9/2016 | Chang | B32B 27/14 |
| 2019/0181082 A1* | 6/2019 | Chen | H01L 23/49894 |
| 2019/0348344 A1* | 11/2019 | Lu | H01L 23/49579 |
| 2020/0075502 A1* | 3/2020 | Kim | H01Q 1/2283 |

\* cited by examiner ial to semiconductor
SEMICONDUCTOR DEVICE AND METHOD OF FORMING RDL WITH GRAPHENE-COATED CORE

FIELD OF THE INVENTION

The present invention relates in general to semiconductor devices and, more particularly, to a semiconductor device and method of forming a redistribution layer containing graphene core shells embedded within a matrix.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor devices often contain a semiconductor die or substrate with electrical interconnect structures, e.g., redistribution layers (RDL) formed over one or more surfaces of the semiconductor die or substrate to perform necessary electrical functions. Electrical components can be placed on a surface of the substrate to form a system-in-package (SIP) module. The substrate may have multiple layers to accommodate the often complex RDL function. A multilayer substrate for electrical interconnect can substantially increase manufacturing cost.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
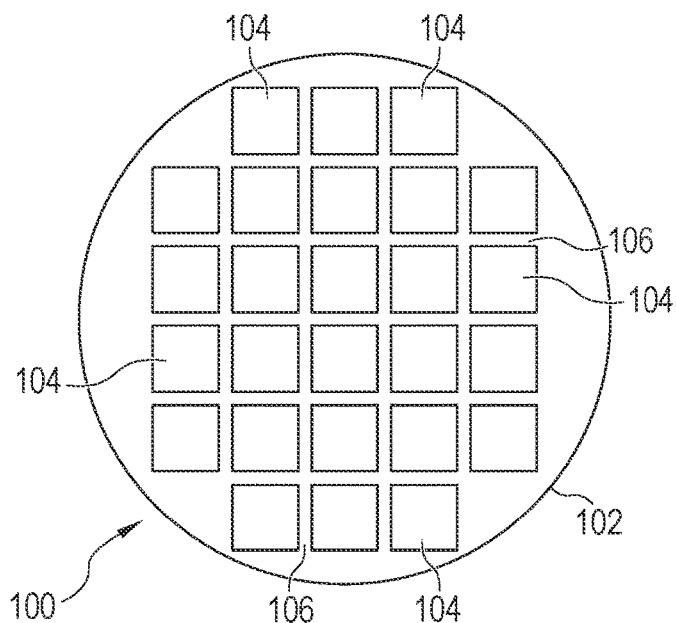
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm). Alternatively, wafer 100 can be a mold surface, organic or inorganic substrate, or target substrate suitable for graphene transfer.

Figure 1B:
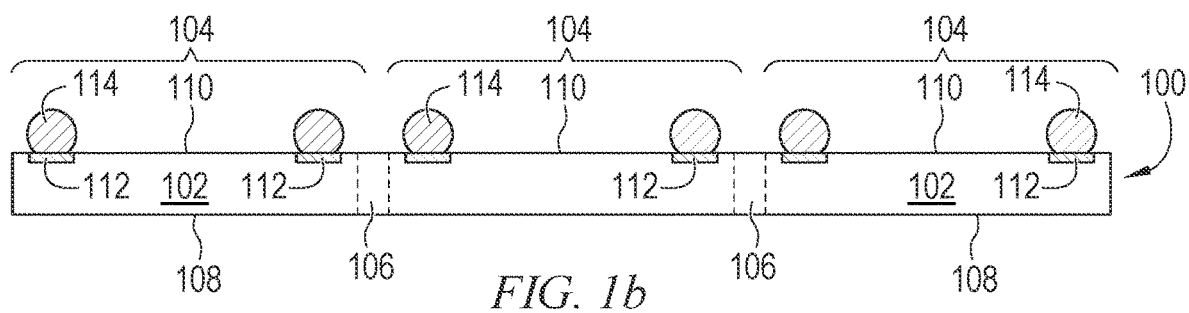

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 2A:
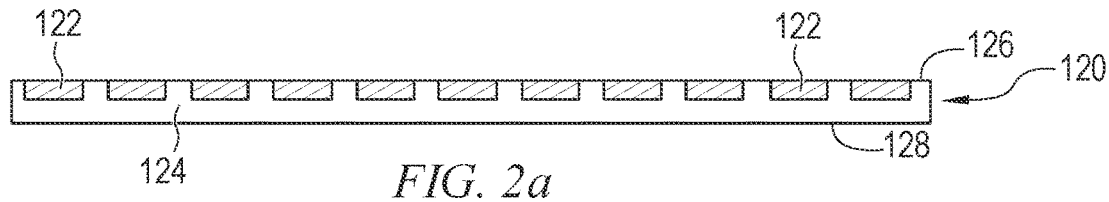
FIGS. 2a-2h illustrate a process of forming an RDL with a graphene Cu core for a SiP.

FIGS. 2a-2h illustrate a process of forming an RDL with a graphene Cu core for a SiP. FIG. 2a shows a cross-sectional view of interconnect substrate 120 including conductive layer 122 and insulating layer 124. Conductive layer 122 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 122 provides horizontal electrical interconnect across substrate 120. Portions of conductive layer 122 can be electrically common or electrically isolated depending on the design and function of semiconductor die 104 and other electrical components. Insulating layer 124 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide, benzocyclobutene (BCB), polybenzoxazoles (PBO), FR4, and other material having similar insulating and structural properties. Insulating layers can be formed using PVD, CVD, printing, lamination, spin coating, spray coating, sintering or thermal oxidation. Insulating layer 124 provides isolation between conductive layers 122. In one embodiment, substrate 120 can be a single layer PCB.

Figure 1C:
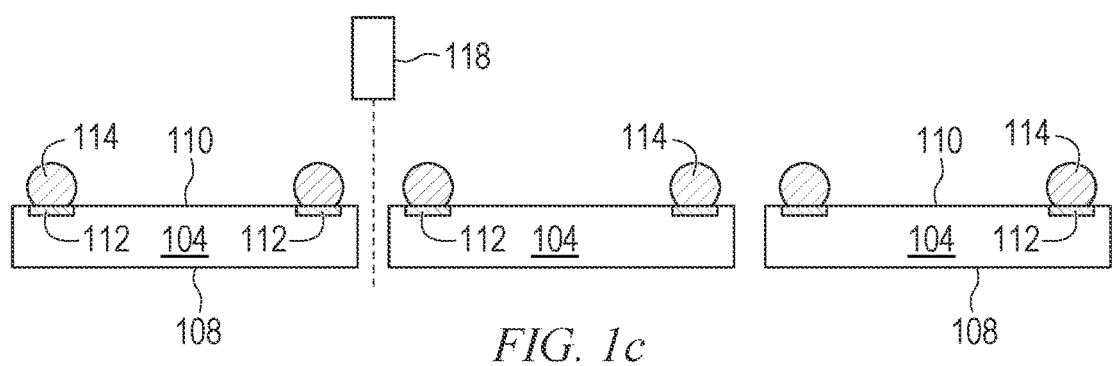
Figure 2B:
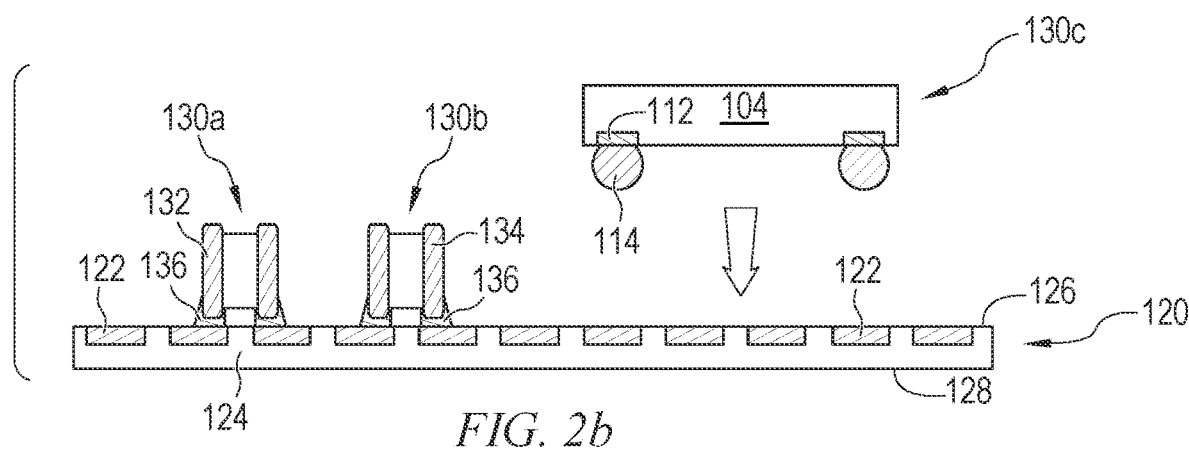
Figure 2C:
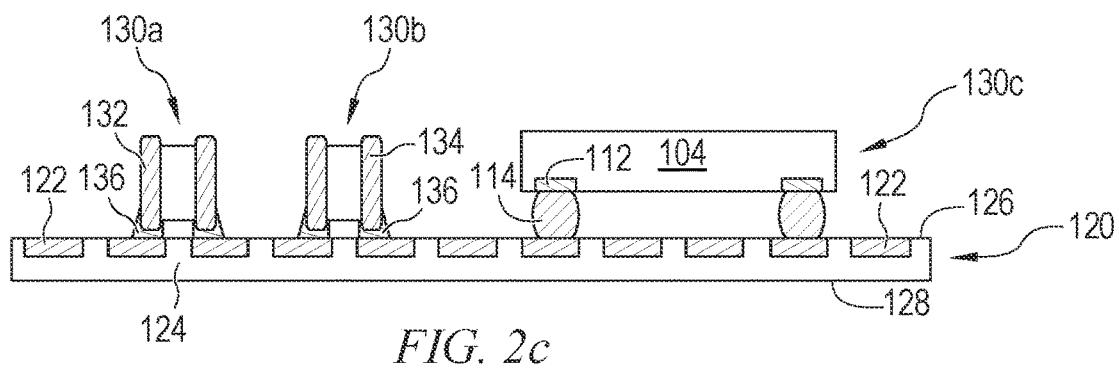

In FIG. 2b, electrical components 130a-130c are disposed on surface 126 of interconnect substrate 120 and electrically and mechanically connected to conductive layers 122. Electrical components 130a-130c are positioned over substrate 120 using a pick and place operation. For example, electrical components 130a and 130b can be discrete electrical devices, or IPDs, such as a diode, transistor, resistor, capacitor, and inductor. Electrical component 130c can be semiconductor die 104 from FIG. 1c with bumps 114 oriented toward surface 126 of substrate 120. Alternatively, electrical components 130a-130c can include other semiconductor die, semiconductor packages, surface mount devices, RF components, discrete electrical devices, or integrated passive devices (IPD). FIG. 2c illustrates electrical components 130a-130c electrically and mechanically connected to conductive layers 122 of substrate 120. Conductive paste or solder 136 provides electrical and mechanical connection to terminals 132 and 134 of electrical components 130a and 130b, respectively. Bumps 114 provide electrical and mechanical connection for electrical component 130c.

Figure 2D:
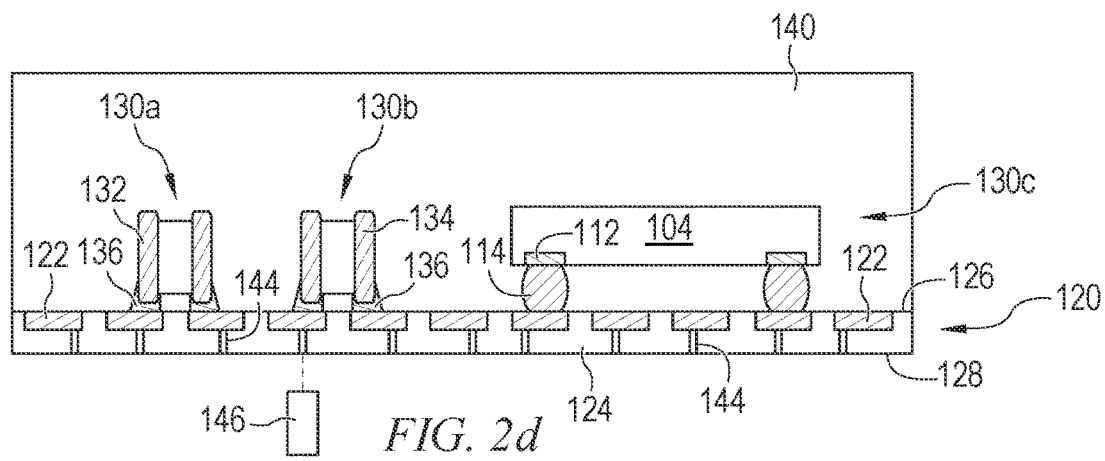

In FIG. 2d, encapsulant or molding compound 140 is deposited over and around electrical components 130a-130c and substrate 120 using a paste printing, compressive molding, transfer molding, liquid encapsulant molding, vacuum lamination, spin coating, or other suitable applicator. Encapsulant 140 can be liquid or granular polymer composite material, such as epoxy resin with filler, epoxy acrylate with filler, or polymer with proper filler. Encapsulant 140 is non-conductive, provides structural support, and environmentally protects the semiconductor device from external elements and contaminants.

Figure 2E:
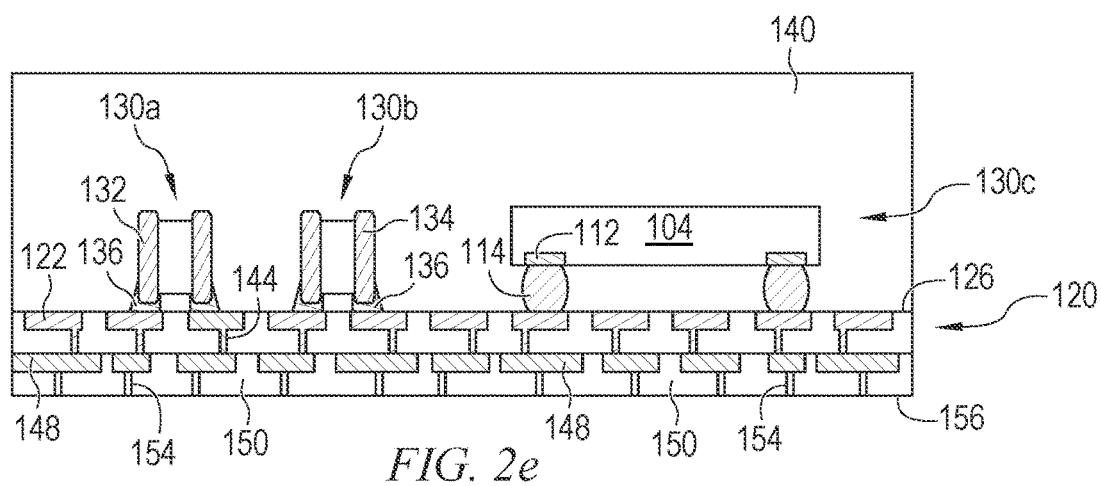

A plurality of openings or vias 144 is formed in insulating layer 124 from surface 128 using an etching process or laser direct ablation (LDA) with laser 146 to expose conductive layer 122. In FIG. 2e, conductive material 148 is deposited over surface 128 and into openings 144, e.g. by printing. In particular, conductive material 148 includes a plurality of cores surrounded or covered by graphene embedded in matrix, see FIGS. 3-5 for further details. The printed conductive material 148 becomes a portion of conductive RDL 168. An insulating layer 150 is formed around conductive material 148 for electrical isolation.

Figure 2F:
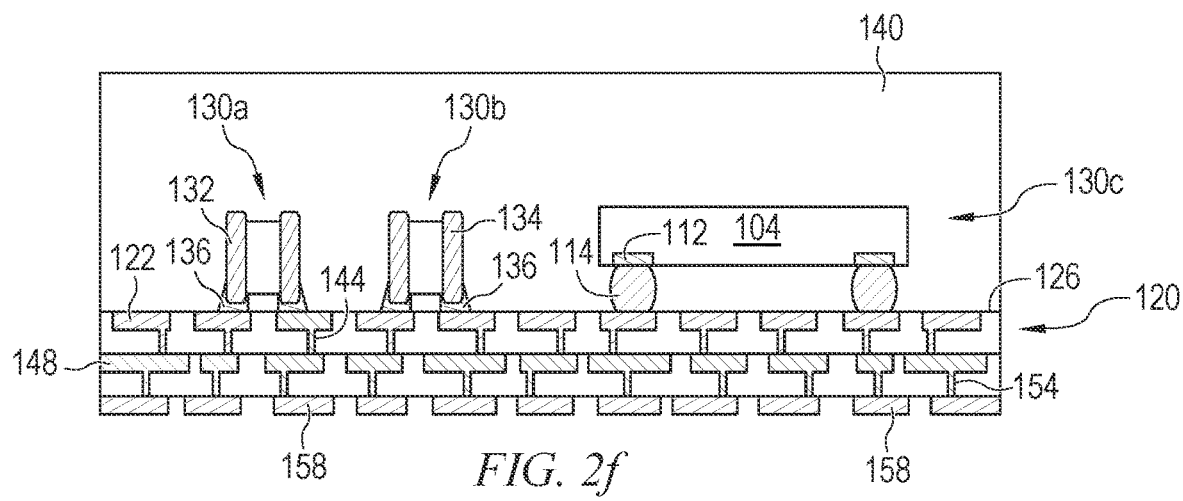

A plurality of openings or vias 154 is formed in insulating layer 150 using an etching process or LDA from surface 156 to expose conductive material 148, similar to FIG. 2d. In FIG. 2f, conductive material 158 is deposited over surface 156 and into openings 154, e.g., by printing. In particular, conductive material 158 includes a plurality of cores surrounded or covered by graphene embedded in matrix, similar to conductive material 148, see FIGS. 3-5 for further details. The printed conductive material 158 becomes a portion of conductive RDL 168. Conductive material 158 can be the bump pad of RDL 168, as shown in FIG. 2f.

Figure 2G:
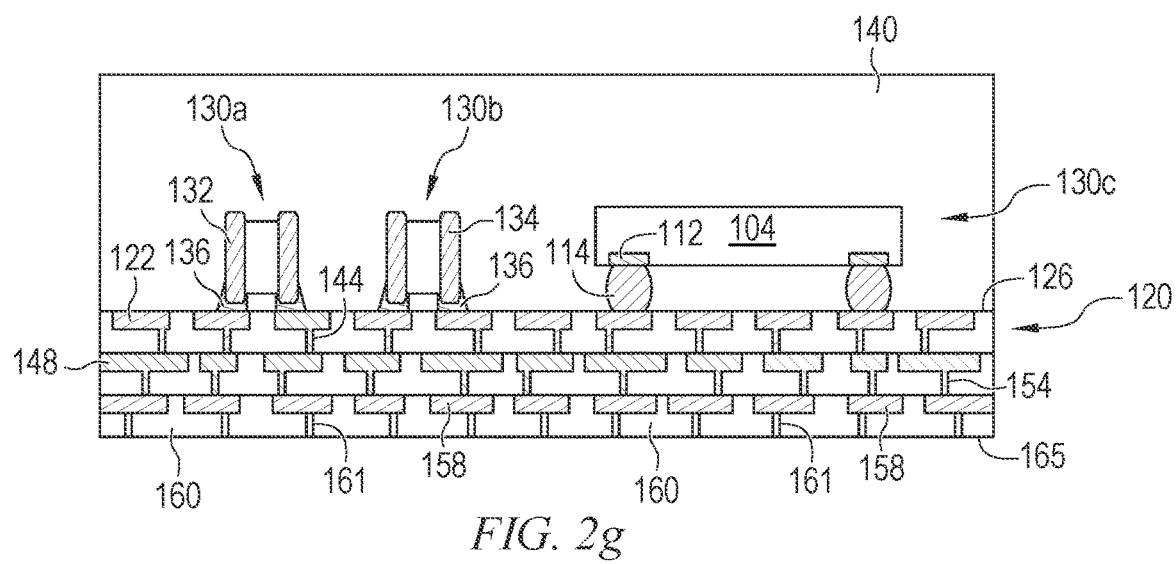
Figure 2H:
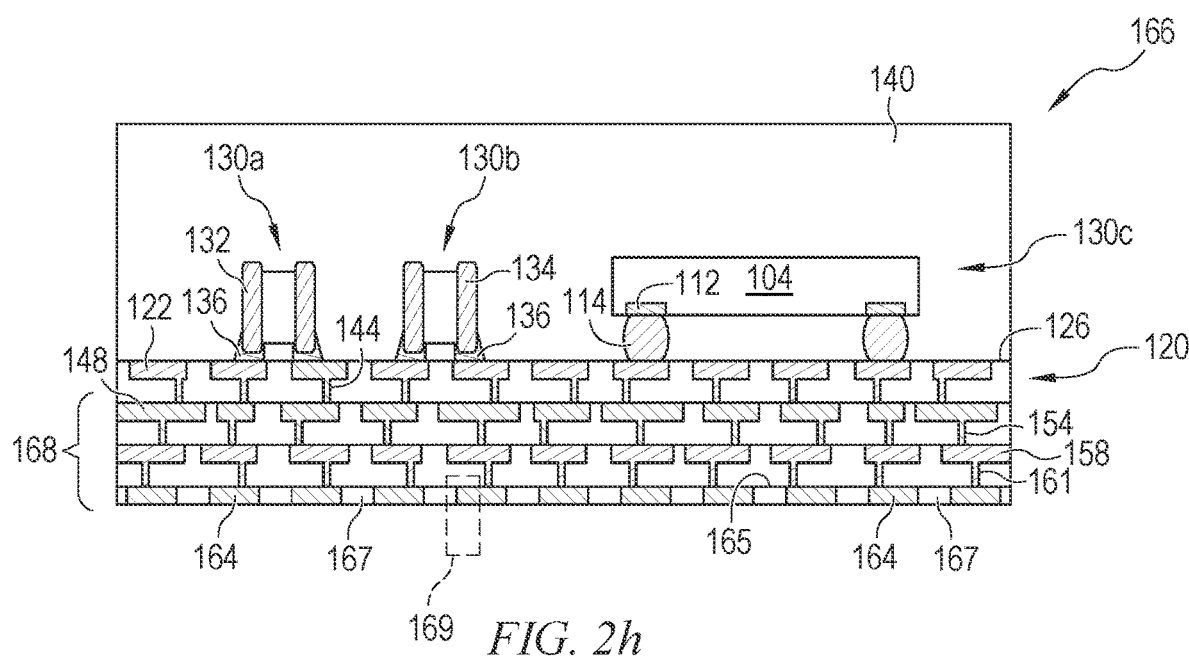

To further expand RDL 168, insulating layer 160 is formed around conductive material 158 for electrical isolation, as shown in FIG. 2g. A plurality of openings or vias 161 is formed in insulating layer 160 using an etching process or LDA from surface 165 to expose conductive material 148, similar to FIG. 2d. In FIG. 2h, conductive material 164 is deposited over surface 165 and into openings 161, e.g., by printing. In particular, conductive material 164 includes a plurality of cores surrounded or covered by graphene embedded in matrix, similar to conductive material 148 and 158, see FIGS. 3-5 for further details. The printed conductive material 164 becomes a portion of conductive RDL 168. Conductive material 164 can be the bump pad of RDL 168. An insulating layer 167 can be formed around conductive material 164 for electrical isolation. Insulating layers 150, 160, and 167 contain one or more layers of $SiO_2$, $Si_3N_4$, SiON, $Ta_2O_5$, $Al_2O_3$, solder resist, polyimide, BCB, PBO, FR4, and other material having similar insulating and structural properties. Insulating layers 150, 160, and 167 can be formed using PVD, CVD, printing, lamination, spin coating, spray coating, sintering or thermal oxidation.

Semiconductor package 166 represents a SIP module including electrical components 130a-130c mounted to the single-layer interconnect substrate 120. Multiple RDL 168 is formed over interconnect substrate 120 and electrically connected to electrical components 130a-130c through the interconnect substrate. RDL 168 comprises multiple layers of conductive material each containing a plurality of cores surrounded or covered by graphene embedded in matrix for improved electrical conductivity and high propagation speed. Substrate 120 is expensive to manufacture so reducing the number of layers, to say one layer, and using RDL 168 for additional vertical and horizontal interconnect capability saves manufacturing costs.

Figure 3:
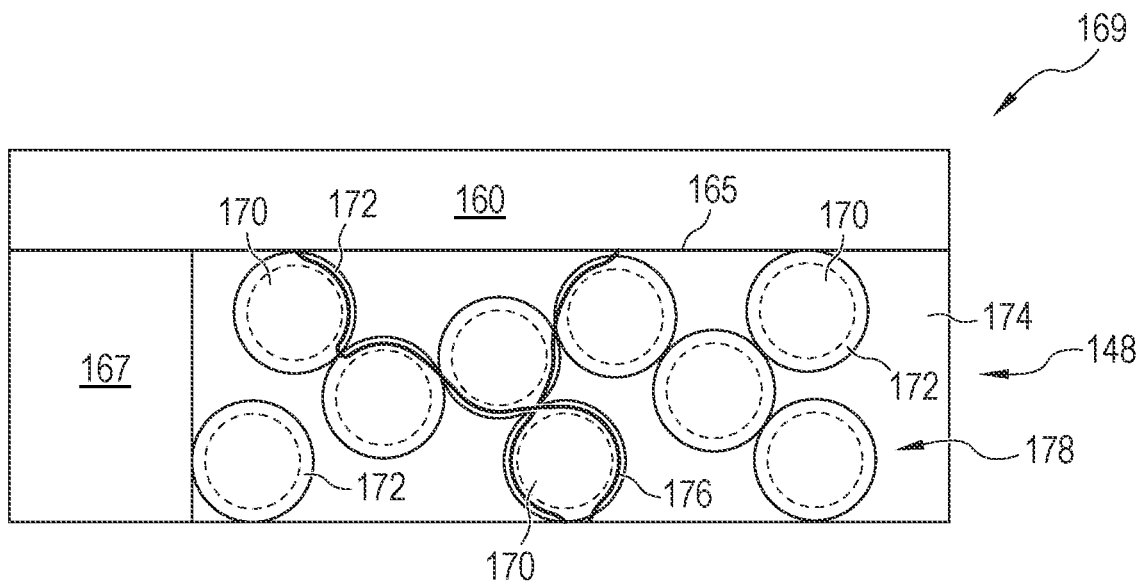
FIG. 3 illustrates graphene Cu core shells within a matrix.

FIG. 3 shows further detail of region or box 169 from FIG. 2h. In one embodiment, conductive material 148 includes a plurality of cores 170 with graphene coating 172 embedded within matrix 174, as shown in FIG. 3. The same is true for conductive material 158 and 164. In one embodiment, matrix 174 is a thermoset material, such epoxy resin or adhesive with filler containing alumina, Al, aluminum zinc oxide, or other material having good heat transfer and electrically conductive properties. Matrix 174 can be thermal grease such as silicon or polymer type such as polymethyl methacrylate (PMMA) or polyethylene terephthalate (PET). In one embodiment, core 170 is Cu, Ni, phase change material (PCM), or other suitable metal or similar material. Cores 170 are arranged within matrix 174 so that most if not all graphene coatings 172 covering the core contact at least one adjacent graphene coating to form a continuous and connecting electrical and thermal path 176 of graphene coatings through RDL 168. A first graphene coating 172 contacts a second adjacent graphene coating, which in turn contacts a third adjacent graphene coating, and so on, to form continuous and connecting path 176 through RDL 168. Cores 170 have sufficient density that most if not all the graphene coatings around the cores contact at least one graphene coating around an adjacent core, and typically contact graphene coating of multiple adjacent cores. In one embodiment, continuous and connecting path 176 is an electrical and thermal path for high electrical conductivity for RDL 168, while dissipating heat away from SIP 166.

Figure 4:
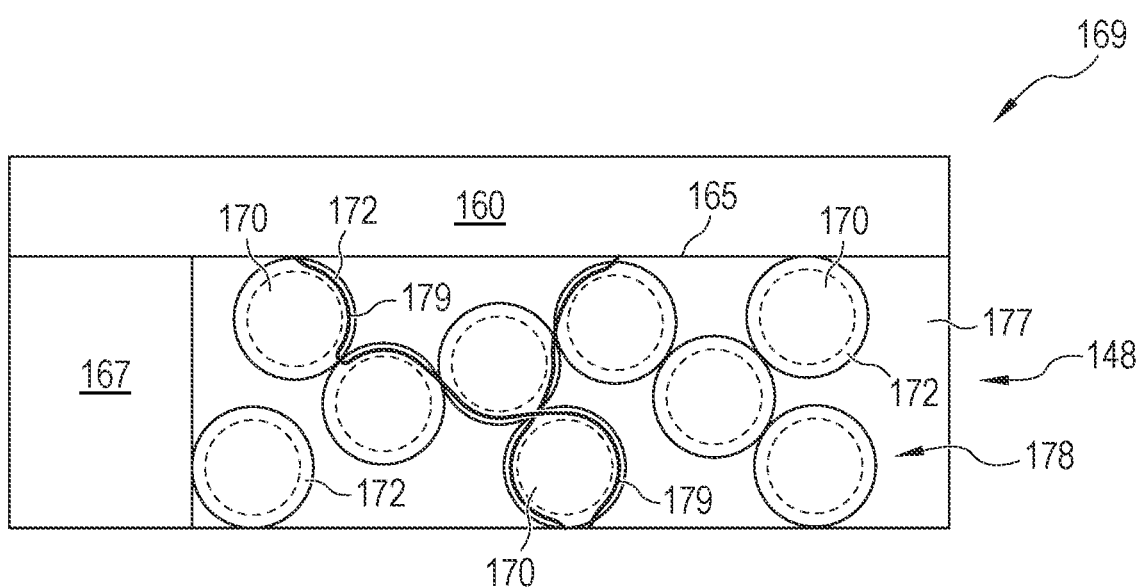
FIG. 4 illustrates another embodiment of graphene Cu core shells within a matrix.

In another embodiment, FIG. 4 shows further detail of region or box 169 from FIG. 2h. In this case, matrix 177 is solder containing one or more elements of Sn, lead (Pb), or indium (In). Again, core 170 can be Cu, Ni, PCM, or other suitable metal or similar material. Each core 170, as embedded in matrix 177, is surrounded or covered by graphene coating or shell 172. In one embodiment, a graphene paste or ink is formed around a Cu core as graphene core shell 178.

Cores 170 are arranged within matrix 177 so that most if not all graphene coatings 172 covering the core contact at least one adjacent graphene coating to form a continuous and connecting path 179 of graphene coatings through RDL 168. Graphene coating 172 of each core 170 contacts the graphene coating of an adjacent core. A first graphene coating 172 contacts a second adjacent graphene coating, which in turn contacts a third adjacent graphene coating, and so on, to form continuous and connecting path 179. Cores 170 have sufficient density that most if not all the graphene coatings around the cores contact at least one graphene coating around an adjacent core, and typically contact graphene coating of multiple adjacent cores.

Figure 5A:
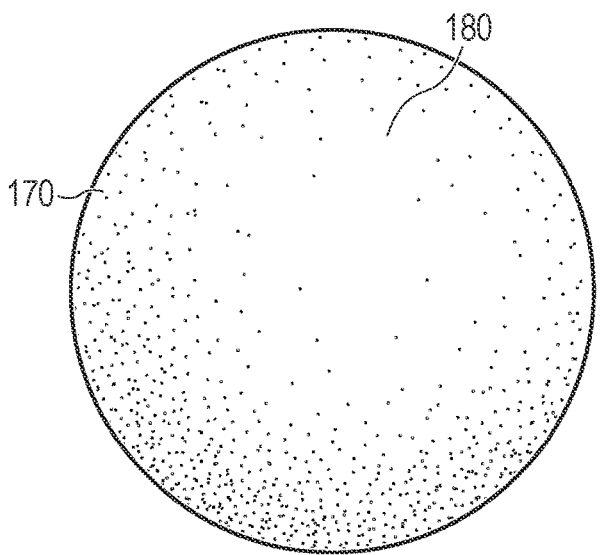
FIGS. 5a-5c illustrate a process of forming a graphene core shell.
Figure 5B:
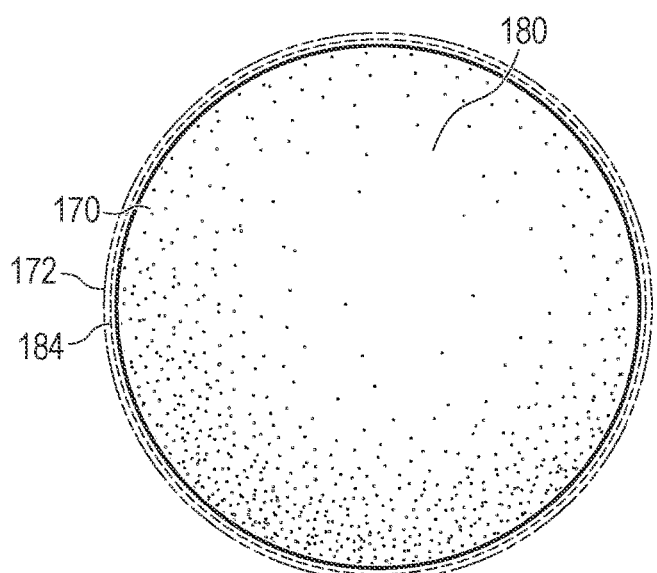
Figure 5C:
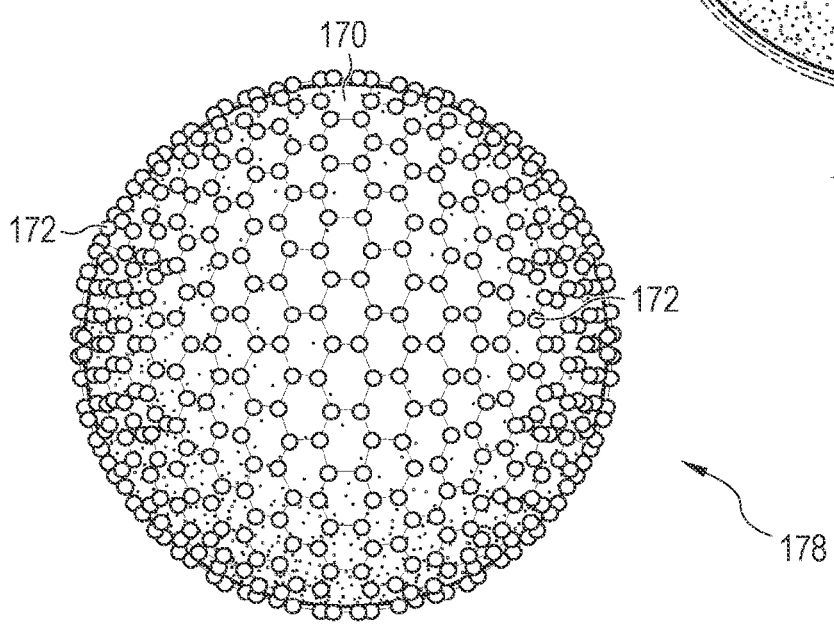

FIGS. 5a-5c illustrate further detail of core 170, graphene coating 172, and graphene core shell 178. In one embodiment, core 170 is Cu, Ni, PCM, or other suitable metal or similar material. FIG. 5b illustrates graphene coating 172 formed over and around surface 180 of core 170. FIG. 5c illustrates further detail of graphene coating 172 formed as a mesh network around surface 180 of core 170, collectively graphene core shell 178. Graphene 172 is an allotrope of carbon with one or more layers of carbon atoms each arranged in a two-dimensional (2D) honeycomb lattice. Graphene coating 172 can be formed by CVD. Core 170 is placed in a chamber heated to 900-1080° C. A gas mixture of $CH_4/H_2/Ar$ is introduced into the chamber to initiate a CVD reaction. The carbon source decomposes in the high-temperature reaction chamber as the CVD reaction separates the carbon atoms from the hydrogen atoms, leaving graphene coating 172 on surface 180 of core 170. The release of carbon atoms over core 170 forms a continuous sheet of graphene coating 172. Additional information related to forming graphene coating by CVD is disclosed in U.S. Pat. No. 8,535,553, and hereby incorporated by reference.

Core 170 is PCM capable of phase change from solid to liquid phase or from liquid phase to solid phase within the operating temperature range of the semiconductor chip, e.g., 20-200° C. A first coating 184 is formed around PCM core 170, as shown in FIG. 5b and discussed in published Korean application KR101465616B1. The first coating 184 can be a polymer intermediate layer. A second coating 172 is formed over the first coating 184. Matrix 174, 177 with graphene covered cores is further disclosed in U.S. patent Ser. No. 10/421,123, and all are incorporated herein by reference.

The properties of graphene are summarized in Table 1, as follows:

TABLE 1

| Properties of graphene | |
|---|---|
| Parameter | |
| Electronic mobility | $2 \times 10^5$ cm$^2$ V$^{-1}$ s$^{-1}$ |
| Current density | $10^9$ A cm$^{-1}$ |
| Velocity of fermion (electron) | $10^6$ m s$^{-1}$ |
| Thermal conductivity | 4000-5000 W m$^{-1}$ K$^{-1}$ |
| Tensile strength | 1.5 Tpa |
| Breaking strength | 42 N m$^{-1}$ |
| Transparency | 97.7% |
| Elastic limit | 20% |
| Surface area | 2360 m$^2$ g$^{-1}$ |

Graphene 172 has ten times the electrical conductivity of Cu. Graphene 172 enables epoxy to exhibit electrical conductivity similar to Ag, while reducing or eliminating oxidation. Core shell 178 with Cu and graphene epoxy is low cost, as compared to sputtering. Graphene 172 has a low moisture permeability and a high thermal conductivity of 4000-5000 W m$^{-1}$ K$^{-1}$, 10 times higher than Cu at room temperature. Since carbon also has a good solderability and wettability of solder paste, conductive material 148, 158, and 164 can be readily formed. Graphene 142 exhibits a high degree of flexibility and remains stable against warpage. Conductive material 148, 158, and 164 with graphene Cu shells 178 improves electrical conductivity of RDL 168, while lowering manufacturing cost.

SIP 166 has a single layer substrate 120 to save manufacturing cost. The remainder of the horizontal and vertical interconnect function is allocated to RDL 168 containing conductive material 148, 158, and 164 with graphene Cu shells 178. The graphene filler conductive material 148, 158, and 164 has low resistance, high electrical conductivity, high propagation speed, and lower manufacturing cost.

Figure 6A:
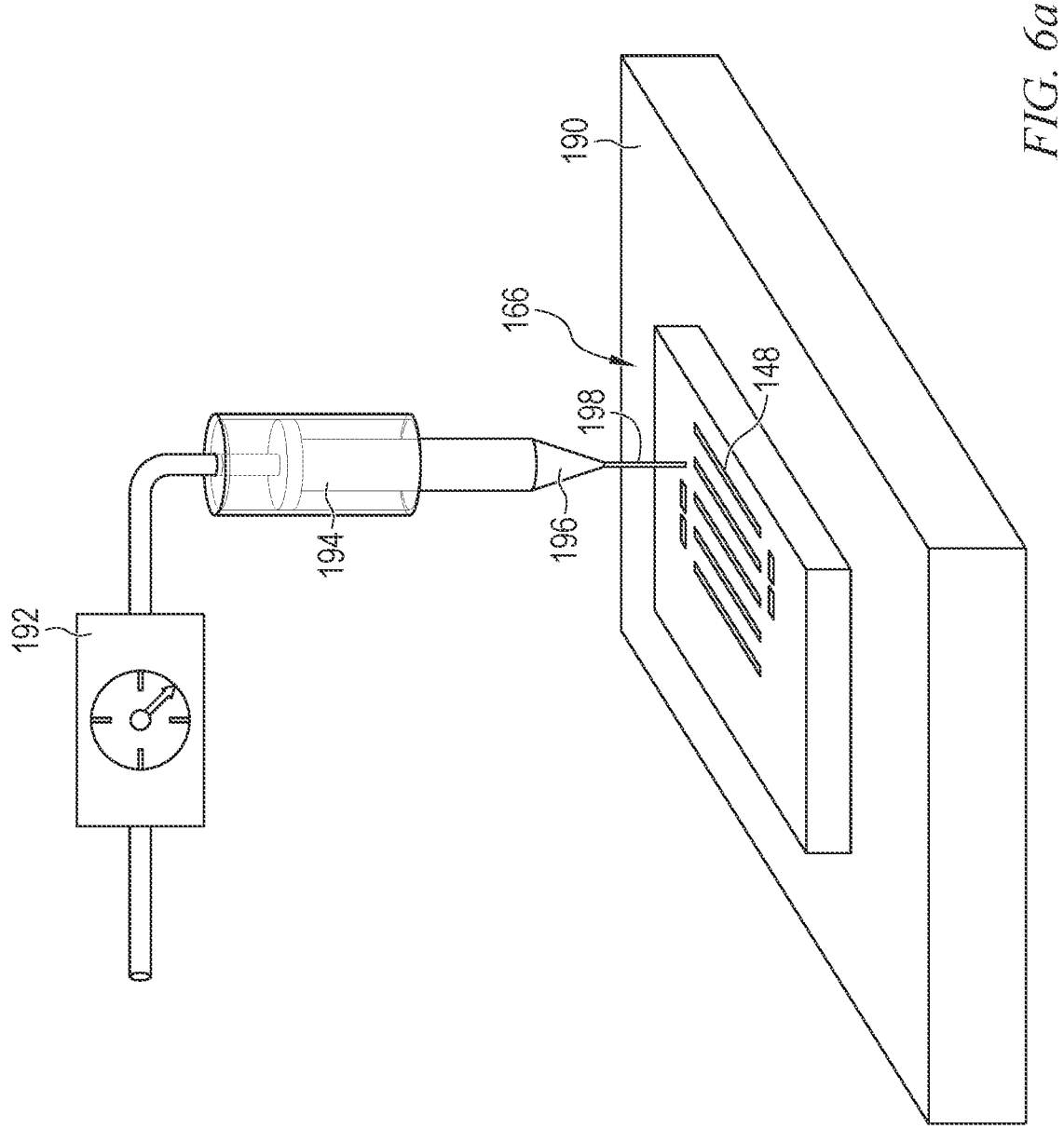
FIGS. 6a-6b illustrate using EHD jet printing to deposit the shielding material over a surface of the SiP.
Figure 6B:
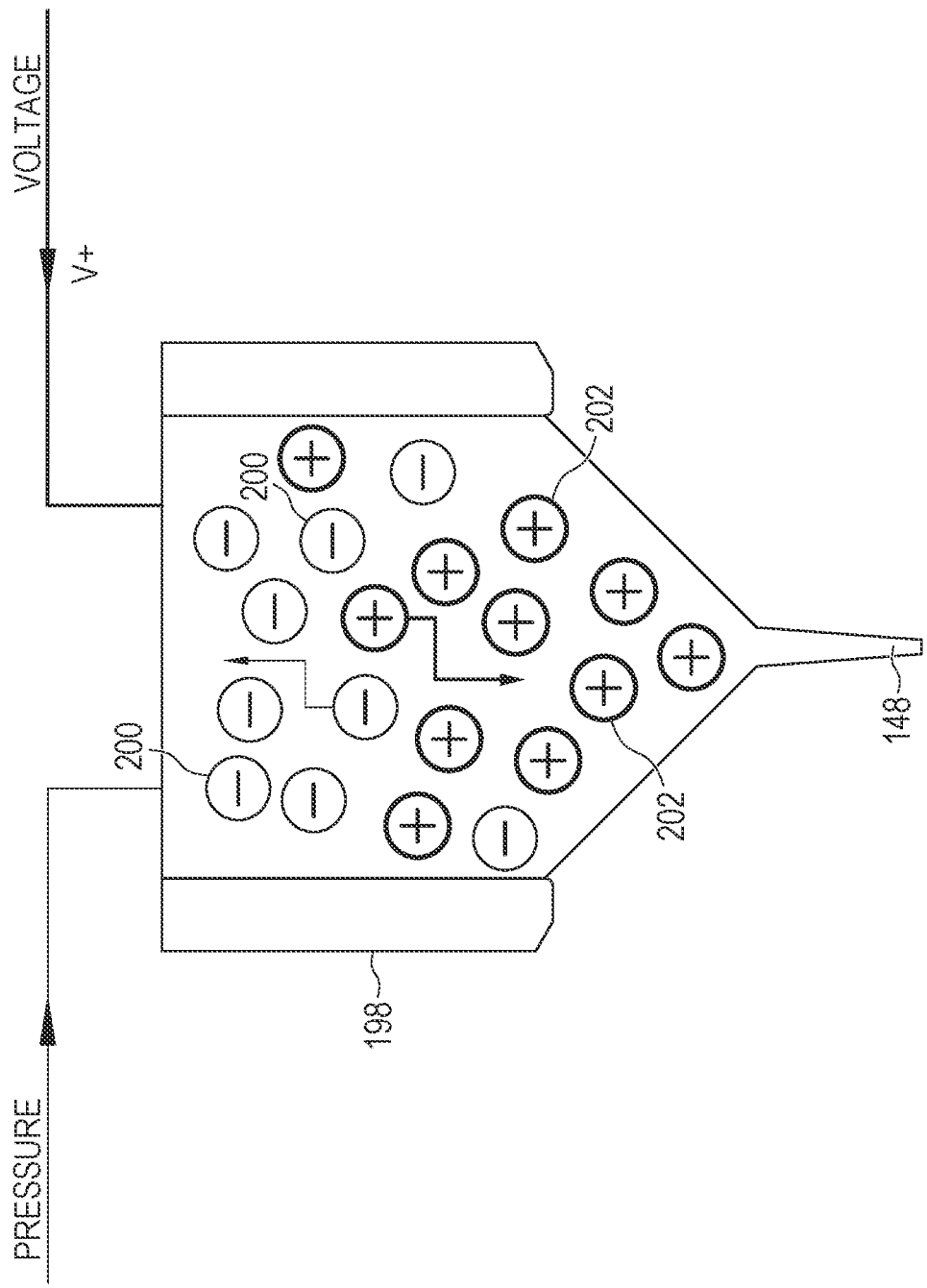

FIG. 6a shows depositing conductive material 148 over SiP 166 using electrohydrodynamic (EHD) jet printing. SiP 166 is placed on substrate 190 capable of three dimensional (x, y, z directions) movement to control distribution of conductive material. Pneumatic regulator 192 with pressure gauge applies pressure to syringe pump 194 containing conductive material 148. Conical section 196 narrows the ink path to injection nozzle 198, which deposits conductive material 148 in a controlled manner. More specifically, injection nozzle 198 performs ink jetting by an electric field and pressure between the nozzle and substrate. In FIG. 6b, pressure is applied from pneumatic regulator 192. A voltage source induces an electric field shown as negative charges 200 and positive charges 202. The printed liquid, i.e., conductive material 148, is driven by the electric field to achieve direct pattern, high resolution printing of the conductive material. The same applies for conductive material 158 and conductive material 164.

Figure 7:
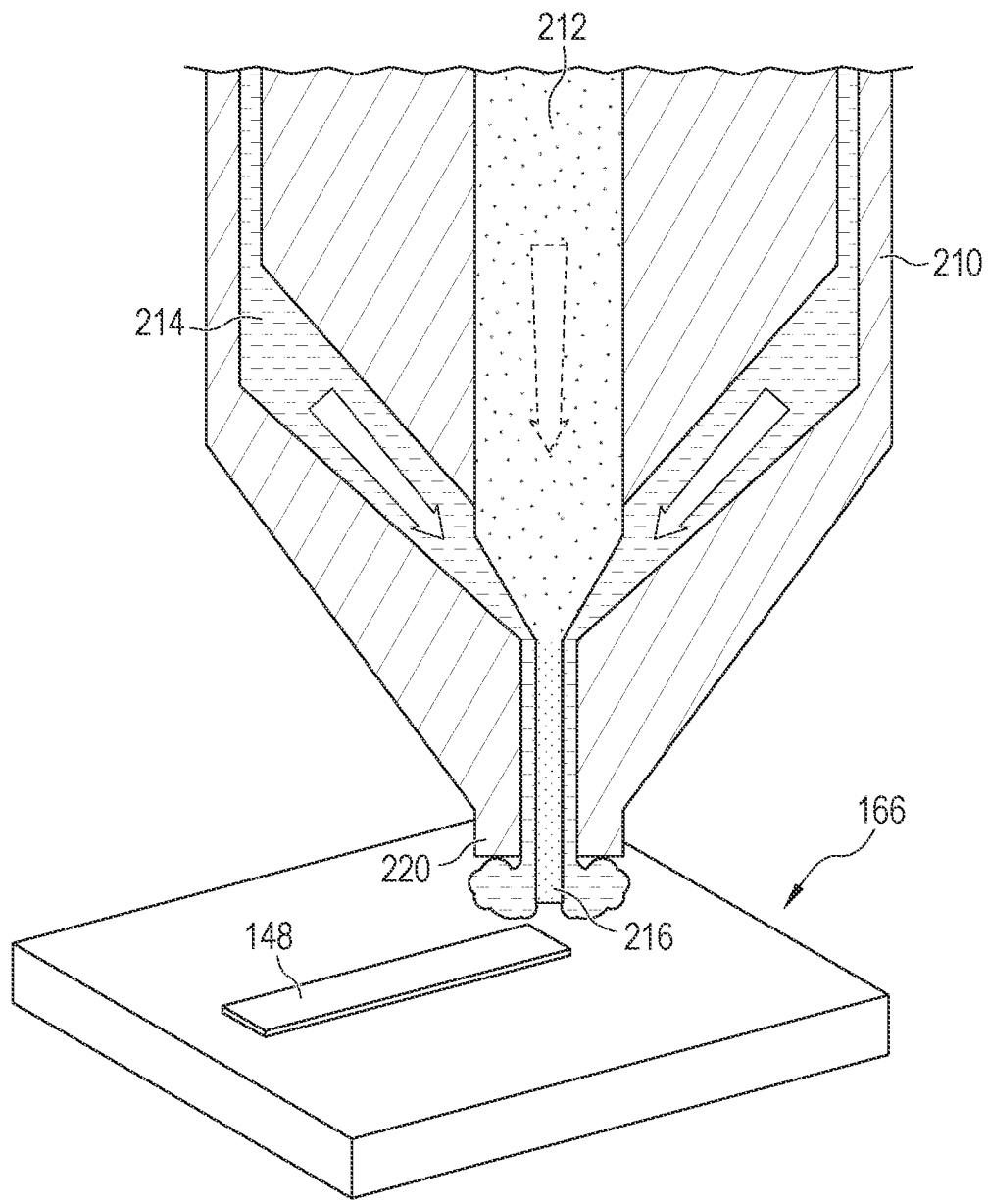
FIG. 7 illustrates using aerosol jet printing to deposit the shielding material over a surface of the SiP.

FIG. 7 shows depositing conductive material 148 over SiP 166 using aerosol jet printing. Dispenser 210 includes channel 222 for the flow of conductive material 148, and channel 214 for the flow of a gas, such as nitrogen. The shielding material is mixed with the gas and deposits the ink from nozzle or head 220 as an aerosol jet. The printed liquid, i.e., conductive material 148 is dispensed as a jetting of aerosol focused by sheath gas at the end of head 220. The features of FIGS. 6a-6b and 7 apply for conductive material 148, 158, and 164.

Figure 8:
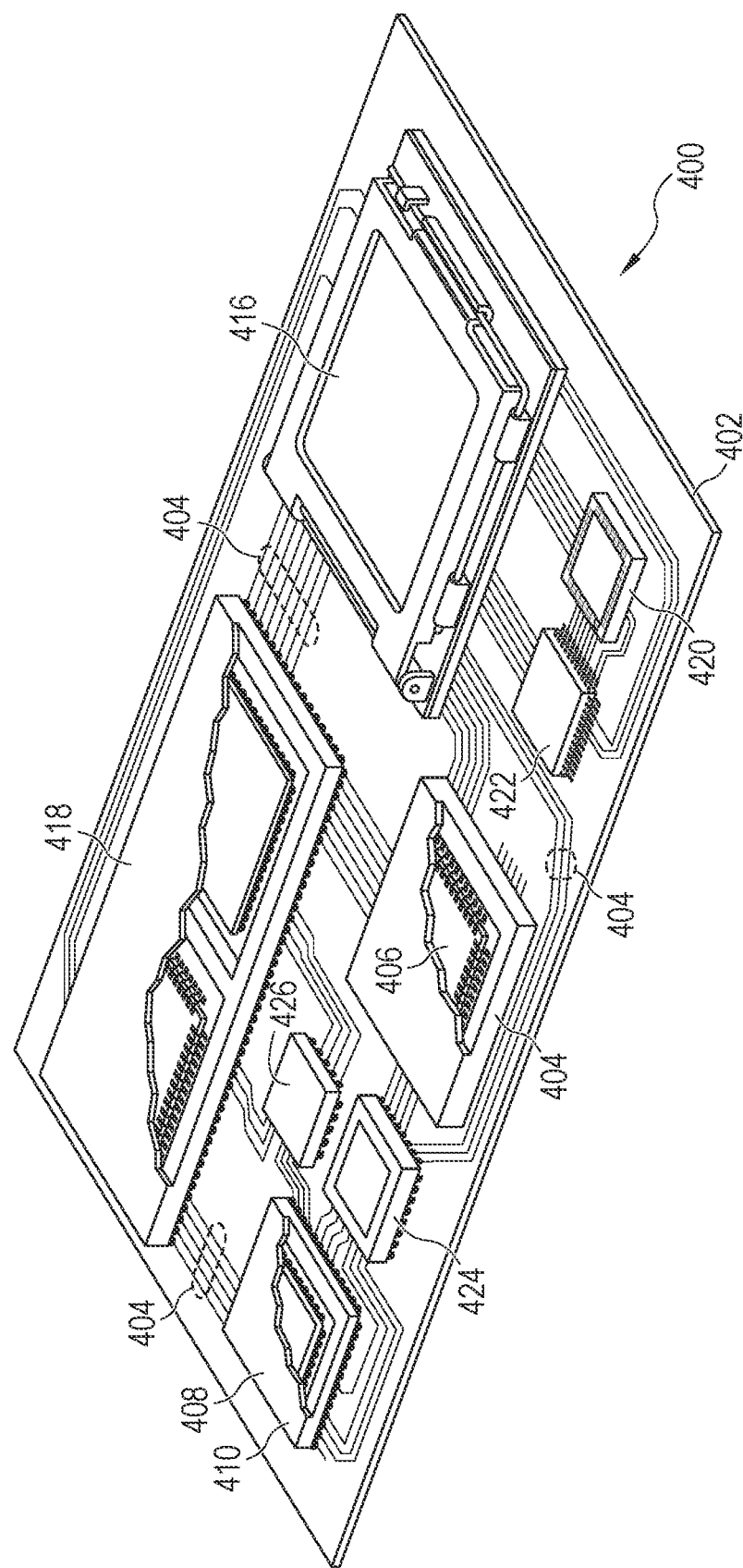
FIG. 8 illustrates a printed circuit board (PCB) with different types of packages disposed on a surface of the PCB.

FIG. 8 illustrates electrical device 400 having a chip carrier substrate or PCB 402 with a plurality of semiconductor packages disposed on a surface of PCB 402, including SIP 166. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 8, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a substrate;
an electrical component disposed over a first surface of the substrate; and
a conductive layer including a plurality of graphene core shells formed over a second surface of the substrate opposite the first surface of the substrate, wherein each graphene core shell of the plurality of graphene core shells contacts another graphene core shell to form a continuous electrical path through the graphene core shells between a first surface of the conductive layer and a second surface of the conductive layer opposite the first surface of the conductive layer.

2. The semiconductor device of claim 1, wherein the graphene core shell includes a copper core.

3. The semiconductor device of claim 2, wherein the graphene core shell further includes a graphene coating formed over the copper core.

4. The semiconductor device of claim 1, wherein the conductive layer further includes a matrix to embed the graphene core shell.

5. The semiconductor device of claim 1, wherein each graphene core shell includes a spherical core with a graphene mesh network disposed over a surface of the spherical core.

6. The semiconductor device of claim 1, wherein the conductive layer includes thermoset material or polymer or composite epoxy type matrix and the graphene core shell is embedded within the thermoset material or polymer or composite epoxy type matrix.

7. A semiconductor device, comprising:
a substrate; and
a redistribution layer (RDL) including a plurality of graphene core shells formed over a first surface of the substrate, wherein each graphene core shell of the plurality of graphene core shells contacts another graphene core shell to form a continuous electrical path through the graphene core shells between a first surface of the RDL and a second surface of the RDL opposite the first surface of the RDL.

8. The semiconductor device of claim 7, further including an electrical component disposed over a second surface of the substrate opposite the first surface of the substrate.

9. The semiconductor device of claim 7, wherein the RDL is printed on the first surface of the substrate.

10. The semiconductor device of claim 7, wherein the graphene core shell includes a copper core.

11. The semiconductor device of claim 10, wherein the graphene core shell further includes a graphene coating formed over the copper core.

12. The semiconductor device of claim 7, wherein the RDL further includes a matrix to embed the graphene core shell.

13. The semiconductor device of claim 7, wherein each graphene core shell includes a spherical core with a graphene mesh network disposed over a surface of the spherical core.

14. A method of making a semiconductor device, comprising:
providing a substrate;
disposing an electrical component over a first surface of the substrate; and
forming a conductive layer including a plurality of graphene core shells over a second surface of the substrate opposite the first surface of the substrate, wherein each graphene core shell of the plurality of graphene core shells contacts another graphene core shell to form a continuous electrical path through the graphene core shells between a first surface of the conductive layer and a second surface of the conductive layer opposite the first surface of the conductive layer.

15. The method of claim 14, wherein the graphene core shell includes a copper core.

16. The method of claim 15, wherein the graphene core shell further includes forming a graphene coating over the copper core.

17. The method of claim 14, wherein forming the conductive layer further includes providing a matrix to embed the graphene core shell.

18. The method of claim 14, wherein each graphene core shell includes a spherical core with a graphene mesh network disposed over a surface of the spherical core.

19. The method of claim 14, wherein the conductive layer includes thermoset material or polymer or composite epoxy type matrix and the graphene core shell is embedded within the thermoset material or polymer or composite epoxy type matrix.

20. A method of making a semiconductor device, comprising:
providing a substrate; and
forming a redistribution layer (RDL) including a plurality of graphene core shells over a first surface of the substrate, wherein each graphene core shell of the plurality of graphene core shells contacts another graphene core shell to form a continuous electrical path through the graphene core shells between a first surface of the RDL and a second surface of the RDL opposite the first surface of the RDL.

21. The method of claim 20, further including disposing an electrical component over a second surface of the substrate opposite the first surface of the substrate.

22. The method of claim 20, wherein forming the RDL includes printing the RDL on the first surface of the substrate.

23. The method of claim 20, wherein the graphene core shell includes a copper core.

24. The method of claim 23, wherein the graphene core shell further includes forming a graphene coating over the copper core.

25. The method of claim 20, wherein each graphene core shell includes a spherical core with a graphene mesh network disposed over a surface of the spherical core.

26. A semiconductor device, comprising:
a substrate; and
a conductive layer including a plurality of graphene core shells formed over a first surface of the substrate, wherein each graphene core shell of the plurality of graphene core shells contacts another graphene core shell to form a continuous electrical path through the graphene core shells.

27. The semiconductor device of claim 26, wherein the graphene core shell includes a copper core.

28. The semiconductor device of claim 27, wherein the graphene core shell further includes a graphene coating formed over the copper core.

29. The semiconductor device of claim 26, wherein the conductive layer further includes a matrix to embed the graphene core shell.

30. The semiconductor device of claim 26, wherein each graphene core shell includes a spherical core with a graphene mesh network disposed over a surface of the spherical core.

31. The semiconductor device of claim 26, wherein the conductive layer includes thermoset material or polymer or composite epoxy type matrix and the graphene core shell is embedded within the thermoset material or polymer or composite epoxy type matrix.

32. The semiconductor device of claim 26, further including an electrical component disposed over a second surface of the substrate opposite the first surface of the substrate.

* * * * *